US005084955A

United States Patent [19]

Yamasaki et al.

[11] Patent Number: 5,084,955

[45] Date of Patent: Feb. 4, 1992

[54] METHOD FOR MANUFACTURING A SUPERCONDUCTING MAGNET

[75] Inventors: Akinori Yamasaki; Akihiro Harada; Teruo Miyamoto, all of Ako, Japan

[73] Assignee: Mitsubishi Denki Kabushiki Kaisha, Japan

[21] Appl. No.: 107,049

[22] Filed: Oct. 13, 1987

[30] Foreign Application Priority Data

Oct. 16, 1986 [JP] Japan ............................... 61-244198

[51] Int. Cl.[5] ............................................ H01L 39/24

[52] U.S. Cl. ........................................ 29/599; 29/605; 118/405; 118/420; 118/429; 427/62

[58] Field of Search .................... 29/599, 605; 427/57, 427/62; 118/405, 420, 429

[56] References Cited

U.S. PATENT DOCUMENTS 3,412,354 11/1968 Sattler .............................. 29/605 X
3,418,710 12/1968 Seidel et al. ...................... 29/605 X
3,978,815 9/1976 Carrara .......................... 118/405 X
4,220,620 9/1980 Clifford .......................... 264/562 X
4,407,062 10/1983 Sutcliffe et al. .................. 29/605 X
4,503,605 3/1985 Buckley ................................ 29/605
4,554,730 11/1985 Westervelt et al. .................. 29/605
4,615,106 10/1986 Grimes et al. ........................ 29/605
4,763,402 8/1988 Powilleit .......................... 29/605 X
4,763,404 8/1988 Coffey et al. ......................... 29/599

*Primary Examiner*—Timothy V. Eley
*Attorney, Agent, or Firm*—Leydig, Voit & Mayer

[57] ABSTRACT

A method for manufacturing a superconducting magnet comprising the steps of applying a bonding agent on a length of a superconductor by passing the superconductor through a bath of the bonding agent to thereby coat the superconductor with the bonding agent. The superconductor coated with the bonding agent is simultaneously wound to form a winding which is then hardened by heating for example to form a rigid winding without voids.

6 Claims, 2 Drawing Sheets

METHOD FOR MANUFACTURING A SUPERCONDUCTING MAGNET

BACKGROUND OF THE INVENTION

This invention relates to a method for manufacturing a superconducting magnet and, more particularly, to a method for manufacturing a superconducting magnet in which the windings of the superconductor are made rigid by a bonding agent.

Superconducting coils made of a superconductor wound into a coil are relatively easily quenched at a relatively small current. The reason for this is considered to be an irregular wire movement of a conductor portion of the superconductor forming a coil due to an electromagnetic force acting between the superconductors. When the superconductor moves, it is heated due to friction between the windings. While the heat generated by the wire movement is relatively small, the specific heat of the superconductor at the superconducting condition is very small, so that the superconductor at the superconducting condition is easily heated beyond the critical temperature, resulting in easy quenching.

FIG. 1 illustrates a step of winding the superconductor in a conventional method for manufacturing a superconducting magnet, from which it is seen that a length of superconductor 1 released from a reel 2 is wound on a bobbin 3 to form a winding. The coil thus wound is then immersed into a bath of a thermo-setting resin (not shown) under vacuum to vacuum-impregnate the winding. Then, the vacuum-impregnated winding is removed from the bath and heated to set the resin to firmly secure the turns of the superconductor 1 to each other and to the bobbin 3.

While this vacuum-impregnation is usually effective to rigidly secure the turns of the superconductor 1 to prevent its movement which causes heating by friction, voids 5 such as shown in FIG. 2 can be formed in a thermally-set resin 4 impregnated between the turns of the superconductors 1. When the void 5 is formed in the winding, the superconductors 1 in the void 5 are not supported and can be easily moved due to the electromagnetic force acting between the turns of the superconductors 1, resulting in a destruction of the superconducting phenomenon.

Also, the conventional method requires a very large vessel for containing a resin bath and a winding with a bobbin. Further, various equipment for establishing a vacuum such as a vacuum pump, vacuum conduits, hermetic vessel must be provided, making the facility very large, costly and complicated.

SUMMARY OF THE INVENTION

Accordingly, an object of the present invention is to provide a method for manufacturing a superconducting magnet which is free from the frictional heating of the superconductor due to electromagnetic force acting between the turns of the superconductor.

Another object of the present invention is to provide a method for manufacturing a superconducting magnet which does not need a large, complicated equipment.

A further object of the present invention is to provide a method for manufacturing a superconducting magnet which is free from the frictional heating of the superconductor and which can be carried out by a relatively simple small equipment.

Still another object of the present invention is to provide a method for manufacturing a superconducting magnet which is less easily subject to quenching.

With the above objects in view, the method for manufacturing a superconducting magnet of the present invention comprises the steps of applying a bonding agent on a length of a superconductor by passing the superconductor through a bath of the bonding agent. The superconductor coated by the bonding agent is wound before the bonding agent is cured, and then the bonding agent on the wound superconductor is heated to form a rigid winding.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENTS

Figure 1:
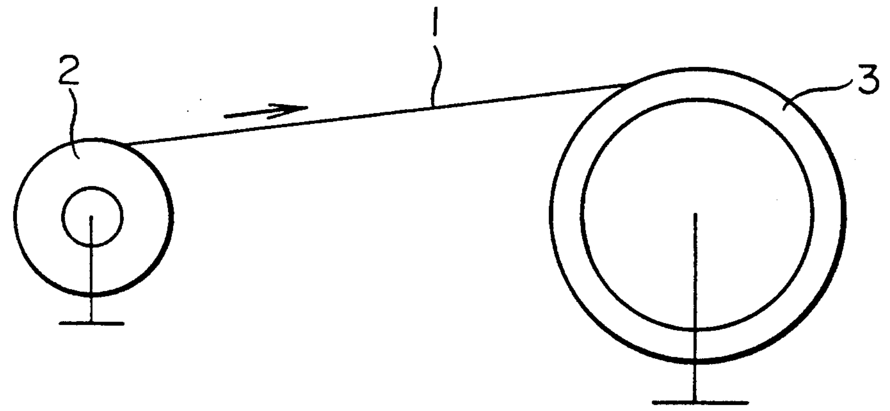
FIG. 1 PRIOR ART
FIG. 1 is a schematic view illustrating the conventional method in which the superconductor is wound on a bobbin.
Figure 2:
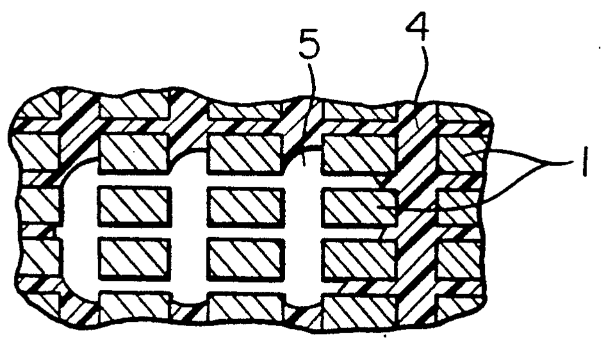
FIG. 2 PRIOR ART
FIG. 2 is a fragmental cross sectional view taken along a plane perpendicular to the direction of extension of the turns of the superconductor manufactured according to the conventional vacuum-impregnation method.
Figure 3:
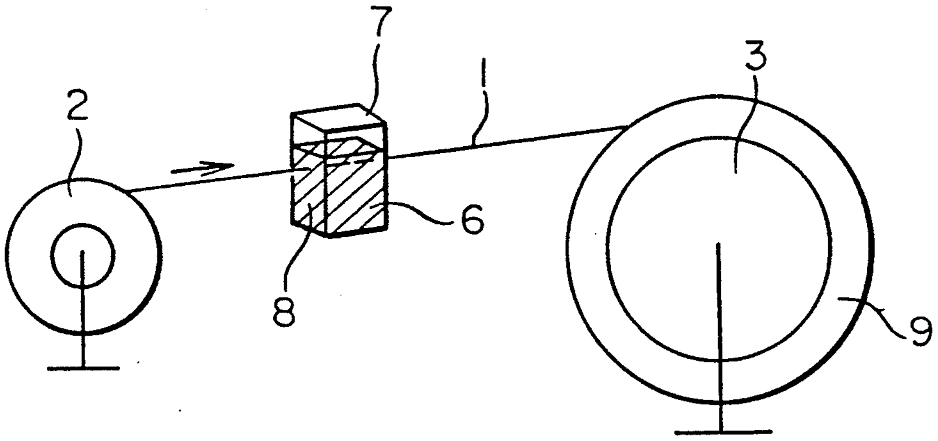
FIG. 3 is a schematic view illustrating the manufacturing method of the present invention in which the superconductor is being wound on the bobbin after the bonding agent is applied.
Figure 4:
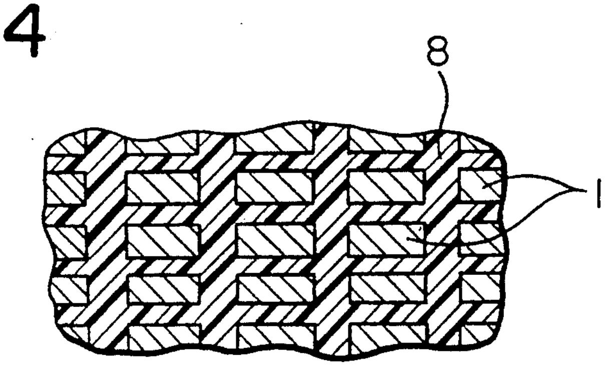
FIG. 4 is a fragmental cross sectional view taken along a plane perpendicular to the direction of extension of the turns of the superconductor of the superconducting magnet manufactured according the to method of the present invention.

FIG. 3 illustrates a step of winding the superconductor in accordance with the method for manufacturing a superconducting magnet of the present invention. From FIG. 3, it is seen that a length of superconductor 1 wound on a the reel 2 is passed through a bath 6 of a bonding agent 8 of a non-solvent type contained in a vessel 7. The bonding agent 8 of the non-solvent type which may be used in the present invention includes epoxy resin and urethane resin. The vessel 7 may be of a suitable known type which, although not illustrated, is provided at its opposing side walls with openings with a suitable seal for allowing the entry and the exit of the continuous superconductor through the vessel 7 without causing any leakage of the liquid bonding agent 8 from the openings. Thus, the superconductor 1 leaving the bath 6 and wound on the bobbin 3 is coated with a liquid bonding agent 8. The superconductor 1 thus coated with the bonding agent 8 is wound on the bobbin 3 before the bonding agent 8 is cured to form an electrical winding 9 composed of the bobbin 3 and the coiled superconductor 1. The electrical winding 9 thus formed has substantially no voids as illustrated in FIG. 4 because the superconductor 1 coated with the bonding agent 8 is wound into coil and the bonding agent is not applied after the winding is formed. The electrical winding 9 is then put into a furnace (not shown) for heating to cure the bonding agent 8 to make the turns of the superconductor 1 firmly secured to each other and to the bobbin 3 to form a rigid winding 9 in which substantially no voids are found.

Figure 5:
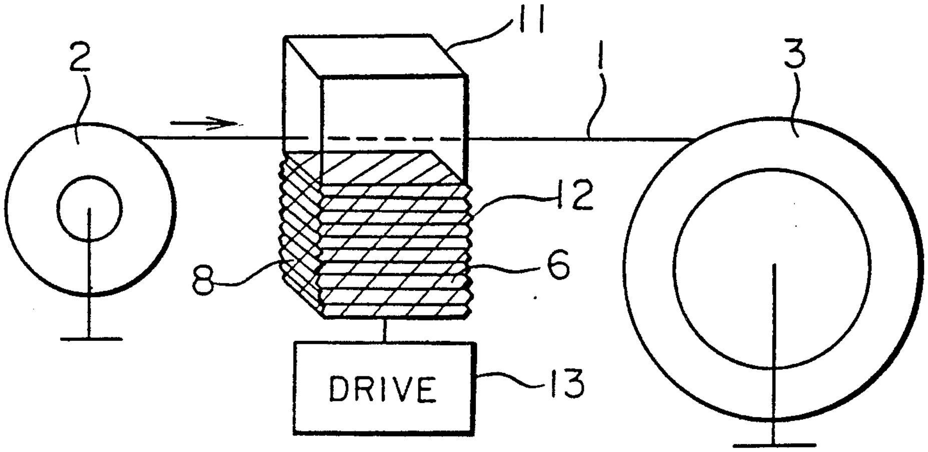
FIG. 5 is a schematic view illustrating another embodiment of the manufacturing method of the present invention.

FIG. 5 illustrates another embodiment of the present invention in which a vessel 11 for containing therein the bath 6 of the bonding agent 8 is a variable-volume vessel including tubular bellows portion 12 as a part of side walls of the vessel 11. The bellows portion 12 is supported by a suitable known drive mechanism 13 so that the bellows portion 12 can expand and contract, thereby increasing and decreasing the volume of the vessel 11. When a leading end of the superconductor 1 is to be passed through the vessel 11, the bellows portion 12 is expanded to lower the bottom wall of the vessel 11 and accordingly the level of the bath 6 in order to facilitate the insertion of the superconductor 1. When applying the bonding agent 8 to the superconductor 1, the bellows portion 12 is contracted to move the bottom wall of the vessel 11 and therefore the level of the bath 6 upward to reach the superconductor 1.

The bonding agent which can be used in the manufacturing method of the present invention includes a solvent type bonding agent in which a vinyl system resin is solved in a solvent and a non-solvent type bonding agent such as epoxy resin, urethane resin, etc. The non-solvent type bonding agent can be preferably used in the method of the present invention because bubbles due to the solvent are eliminated. While the above embodiment has been described in terms of the bonding agent of the thermo-setting type which cures at an elevated temperature, a bonding agent which cures at room temperature may be equally used.

As has been described, according to the present invention, a bonding agent coating is applied on a length of a superconductor while the superconductor is simultaneously wound to form an electrical winding, which is then cured to form a rigid winding, so that substantially no voids are formed in the bonding agent and the windings of superconductor are firmly supported. Therefore, the turns of the superconductor are prevented from being moved due to the electromagnetic force acting between the turns of the superconductors, so that frictional heating can be substantially eliminated to reduce quenching. Also, the vessel used in the present invention for containing a bonding agent bath can be very small as compared to that used in the conventional method because it only requires a resin bath rather than the additional electrical winding with a bobbin as in the conventional method. Further, various equipment for establishing a vacuum such as a vacuum pump, vacuum conduits, hermetic vessel are not needed, enabling the facility to become very small, inexpensive and simple.

What is claimed is:

1. A method for manufacturing a superconducting magnet comprising the steps of:

preparing a bath of a resin;

containing said bath of bonding agent resin within a vessel having a flexible bellows portion;

applying the resin directly on a length of a superconductor by passing the superconductor through the bath of said resin while said superconductor is simultaneously wound to form a winding;

raising and lowering the surface of the bath by expanding and contracting the bellows portion of the vessel to facilitate the passing of said superconductor through said bath and the application of said resin to said superconductor; and hardening said resin on said superconductor to form a rigid winding wherein hardened resin is present between coils of said rigid winding.

2. A method of manufacturing a superconducting magnet comprising:

introducing an end of a superconductor into a variable-volume container containing a resin bath;

increasing the volume of the container to lower the surface of the bath when introducing the superconductor;

decreasing the volume of the container to raise the surface of the bath above the superconductor after introducing the superconductor;

passing the superconductor through the resin bath to coat the superconductor with the resin;

winding the coated superconductor to form a winding; and curing the resin on the superconductor.

3. A method as claimed in claim 2 wherein the winding has a plurality of turns, and the step of winding comprises completely filling the spaces between adjacent turns of the winding with the liquid resin.

4. A method as claimed in claim 2 wherein the winding is performed as the superconductor is being coated.

5. A method as claimed in claim 2 wherein the winding comprises a plurality of layers and the curing is performed after the formation of all of the layers.

6. A method as claimed in claim 2 wherein the resin comprises a non-solvent type resin.

* * * * *

UNITED STATES PATENT AND TRADEMARK OFFICE

CERTIFICATE OF CORRECTION

PATENT NO. : 5,084,955

DATED : FEBRUARY 4, 1992

INVENTOR(S) : YAMASAKI ET AL

It is certified that error appears in the above-identified patent and that said Letters Patent is hereby corrected as shown below:

Title page, item (56), insert:
References: Japanese references, 59151405, 8/84 & 6148905.

Claim 1, column 4, line 9, change "bonding agent" to --said--.

Signed and Sealed this

Thirteenth Day of April, 1993

*Attest:*

STEPHEN G. KUNIN

*Attesting Officer* *Acting Commissioner of Patents and Trademarks*